United States Patent [19]

Baek

[11] Patent Number: 5,670,218
[45] Date of Patent: Sep. 23, 1997

[54] METHOD FOR FORMING FERROELECTRIC THIN FILM AND APPARATUS THEREFOR

[75] Inventor: Yong Ku Baek, Kyoungki-do, Rep. of Korea

[73] Assignee: Hyundai Electronics Industries Co., Ltd., Kyoungki-do, Rep. of Korea

[21] Appl. No.: 729,676

[22] Filed: Oct. 3, 1996

[30] Foreign Application Priority Data

Oct. 4, 1995 [KR] Rep. of Korea ............ 95-33876
Oct. 4, 1995 [KR] Rep. of Korea ............ 95-33877

[51] Int. Cl.$^6$ ............................................. H05H 1/25
[52] U.S. Cl. ............................ 427/576; 118/50; 118/723 I; 118/723 VE; 427/126.3; 427/255.3; 427/294; 427/307; 427/569
[58] Field of Search ........................ 427/569, 576, 427/294, 307, 126.3, 255.3; 118/723 VE, 723 I, 50

[56] References Cited

U.S. PATENT DOCUMENTS 5,187,638  2/1993  Sandhu et al. ............... 361/313
5,489,548  2/1996  Nishioka et al. ............. 437/190

Primary Examiner—Bernard Pianalto
Attorney, Agent, or Firm—Gary M. Nath; Nath & Associates

[57] ABSTRACT

A ferroelectric thin film superior in coatability, fineness of structure and uniformity of composition, is obtained by a method comprised of inducing ferroelectric reactant materials consisting of plural elements into dissociation by exciting plasma with RF power in order for them to participate in a deposition reaction; setting an optimal process condition in which the ions dissociated from the reactant materials by the excited plasma are subjected to deposition at high temperatures under low pressures; supplying the reactant materials through conduits, a manifold and a shower head to a reactor without deterioration, the manifold collecting the reactant materials, the shower head serving to spray the mixed reactant materials; and depositing a ferroelectric thin film in the reactor while purging residual gas from the conduits.

19 Claims, 2 Drawing Sheets

METHOD FOR FORMING FERROELECTRIC THIN FILM AND APPARATUS THEREFOR

BACKGROUND OF THE INVENTION

1. Field of the Invention

The present invention relates to a method for forming semiconductor device and more particularly, to a method for forming a ferroelectric thin film and an apparatus for forming therefor.

2. Description of the Prior Art

In fabricating highly integrated semiconductor devices of 256M or 1 G DRAM or higher scale, BST (barium strontium tetanode), SAO (strontium tetanode $SrTiO_3$) or BTQ (barium tetanode $SrTiO_3$), is typically used as a ferroelectric material for a thin layer of capacitor. Use of such ferroelectric thin layers brings about the advantages of simplifying the process procedure, reducing the production cost and allowing semiconductor devices to be integrated in very large scale.

Conventionally, in order to prepare high dielectric BST, SAO or BTO thin layer, a sputtering method or a sol-gel method in which a solution of raw reactants in an organic solvent is used to coat has usually been employed.

Such conventional methods, however, are not recommended since the application of the thin layer obtained by the methods for highly integrated semiconductor devices is problematic in many aspects including its coatability on fine patterns, fineness in structure and electrical reliability.

For BST thin layer, chemical vapor deposition techniques have recently been developed. However, they cannot achieve a desirable object of a ferroelectric thin layer applicable to highly integrated semiconductor devices.

SUMMARY OF THE INVENTION

Therefore, it is an objective of the present invention to overcome the above problems encountered in prior arts and to provide a method for forming a ferroelectric thin film superior in dielectric properties and an apparatus therefor.

It is another objective of the present invention to provide a method for forming a ferroelectric thin film suitable for fabrication of highly integrated semiconductor devices and an apparatus therefor.

In accordance with an aspect of the present invention, a method for forming a ferroelectric thin film comprises the steps of: inducing ferroelectric reactant materials consisting of plural elements into dissociation by exciting plasma with RF power in order for them to participate in a deposition reaction; setting an optimal process condition in which the ions dissociated from the reactant materials by the excited plasma are subjected to deposition at high temperatures under low pressures; supplying the reactant materials through conduits, a manifold and a shower head to a reactor without deterioration, the manifold collecting the reactant materials, the shower head serving to spray the mixed reactant materials; and depositing a ferroelectric thin film in the reactor while purging residual gas from the conduits.

In accordance with another aspect of the present invention, a method for forming a ferroelectric thin film comprises the steps of: inducing ferroelectric reactant materials consisting of plural elements into dissociation by exciting plasma with RF power, in order for them to participate in a deposition reaction; setting an optimal process condition in which the ions dissociated from the reactant materials by the excited plasma are subjected to deposition at high temperatures under low pressures; combining an amine ligand with the reactant materials and supplying the combined reactant materials through conduits, a manifold and a shower head to a reactor at a high temperature under a low vapor pressure without deterioration, the manifold collecting the reactant materials, the shower head serving to spray the mixed reactant materials; controlling the temperatures of the conduits, the manifold and the shower head; and depositing a ferroelectric thin film in the reactor while purging residual gas from the conduits.

In accordance with a further aspect of the present invention an apparatus for forming a ferroelectric thin film comprises a chamber body defining a depositing space; a manifold provided over the chamber body and for collecting reactant materials; a shower head for converting the reactant materials of the manifold into gaseous ones and for spraying them on a wafer; a baffle guide surrounding the shower head, the wafer and a heating block with the aim of preventing the gas sprayed from the shower head from expanding widely and from leaking into a vacuum port too fast; and a plate for RF electrode provided over the wafer for forming plasma.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The application of the preferred embodiments of the present invention is best understood with reference to the accompanying drawings.

Figure 1:
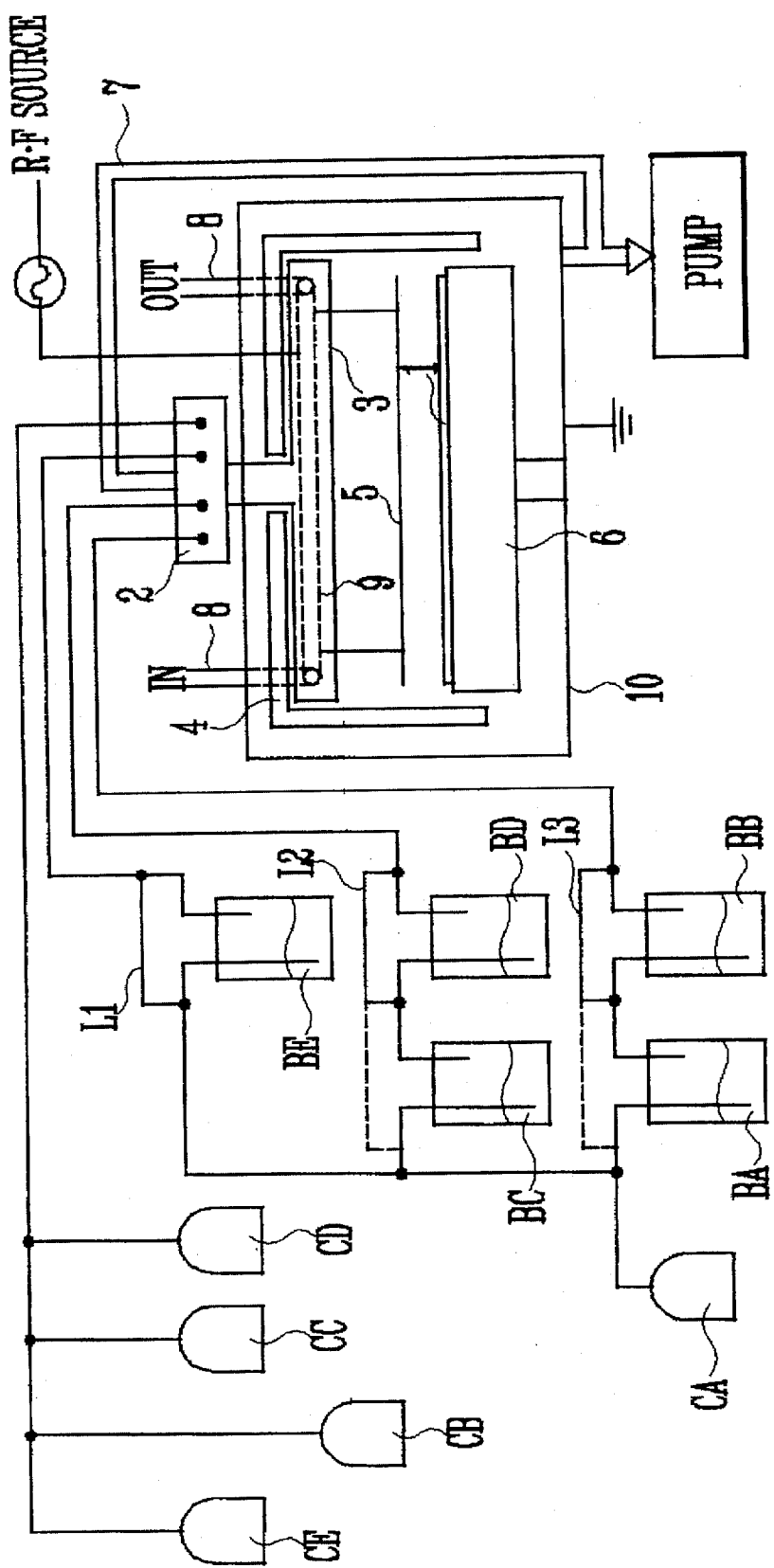
FIG. 1 is a schematic diagram showing an apparatus for forming a BST ferroelectric thin film, according to a first embodiment of the present invention.

First, referring to FIG. 1, an apparatus of depositing a BST thin layer is shown, according to a first embodiment of the present invention.

As seen in FIG. 1, the apparatus for depositing a BST thin layer according to the present invention comprises a chamber body 10 which houses a wafer 1 and defines an inner space for depositing the wafer 1. Over the chamber body 10, there is provided a manifold 2 through which reactant materials are charged into the inner space of the chamber 10. Being connected with the manifold 2, a gas shower head 3 is set within the chamber body 10, in order to spray gaseous reactant materials. Indeed, the gas shower head 3 converts the reaction materials for thin layer coming out of the manifold 2 into a gaseous one and sprays it on the wafer 1. Also, a cylindrical baffle guide 4 is provided within the chamber body 10, surrounding the wafer 1 and the shower head 3. This baffle guide 4 functions to prevent the gas sprayed from the shower head 3 from being diffused too widely or from leaking into a vacuum port too fast. A plate 5 for RF electrode is provided over the wafer 1, in order to form plasma.

A description will be given of a depositing method of ferroelectric BST thin layer using the apparatus, below.

It is convenient to describe the depositing method of ferroelectric BST thin layer largely in three stages: reactant materials and their supply; thin layer deposition; and reproductivity in thin layer deposition.

Initially, reactant materials and their supply are considered.

Since most of Ba and Sr sources maintain themselves in solid states at ordinary temperatures, they should be heated to 150°–200° C. by storage in an isothermal cabinet in order to be supplied to an reactor. Then, a measure is devised to stabilize the sources thermally and chemically. For this, the chemicals (BA, BC) carrying amine group, e.g. $NET_3$ and $NH_3$, are heated at a certain temperature. At this moment, the chemicals are allowed to be in contact with the Ba, Sr sources and to react as a ligand with them by bubbling with $N_2$ gas (CA). The Ba, Sr sources thus carrying amine groups are sublimated and flow into the reactor. The flow rate of the Ba, Sr sources can be controlled with the heating temperatures of the $N_2$ gas (CA), the chemicals (BA, BC) carrying amine group and the Ba, Sr sources.

Ti itself may be used as a Ti source and its flowing into the reactor can be controlled by heating temperature and the flow rate of the $N_2$ gas (CA).

In addition, the reactor is supplied with an oxidizing agent (CD) selected from $N_2O$ and $O_2$ gas.

When the sublimated Ba, Sr, Ti sources reach the reactor, they are heated at about 200° to 250° in order for them not to recondense. Ba, Sr, Ti and $N_2O$ coming out of respective conduits are mixed together in the manifold 2 and then, led to the shower head 3. There is a fear that, within the shower head 3 by which the sublimated reactant materials are uniformly sprayed, gas phase reaction might occur by the thermal energy which is transferred from a heater 6 to heat the wafer 1, so a coolant, such as water, oil, air or $N_2$ gas, is used to control the temperature of the shower head 3 within 200°–250° C.

As to thin layer deposition, the sublimated plural reactant materials are kept at high temperature by plasma excitation at low pressure, thereby giving a good ferroelectric BST thin layer.

The difference in the reaction activation energy among the reaction materials can be reduced by a plasma excitation technique in which RF power is connected to the shower head 3 and transferred through a plate rod for an RF electrode to the RF electrode plate 5. Thus, plasma is generated between the wafer 1 and the RF electrode plate 5, irrespective of the shower head 3.

In order to obtain a quality BST thin layer, process variables can be changed, including, for instance, the gap between the shower head 3 and the wafer 1 which is adjusted so as to allow the gas sprayed through the shower head 3 to be sprayed uniformly on the wafer 1.

In addition, RF electrode plate 5 may be apart a certain distance from the wafer to make plasma easily even at lower RF power, irrespective of its gap from the shower head 3.

When low pressure is maintained to provide the thin layer deposited with good coatability, the gas may flow nonuniformly, the production yield is deteriorated and the plasma expands. For the prevention of these phenomena, the baffle guide 4 surrounding the shower head 3 the heater 6, is made of an electrical insulating material, for instance, ceramic or quartz.

Since most of the Ba, Sr, Ti sources contain a large quantity of carbon and moisture, they must be removed from the highly reactive, nascent oxygen from $N_2O$ plasma at about 500° C. or higher, to produce a quality thin layer. At this time, the heating block 6 in the direct contact with the wafer 1 is used to heat the wafer 1 at about 500° C. or higher.

Finally, it will be described below that the BST thin layer deposited is reproduced in a wafer to wafer manner.

It is necessary to remove the residual gas in the gas conduits. For this, a pumping gas, such as $N_2$ gas or chemicals carrying amine group, is blown in the lines for Ba, Sr, Ti sources and then, pumped out through the manifold 2. This process is carried out just after the BST thin layer deposition, and the flow of the pumping gas traces the routes as follows.

A purging route for Sr line starts from an $N_2$ gas conduit (CA) in which a chemical (BA) carrying amine group is bubbled, extends through a precursor container (BB) of Sr source into the manifold 2 from which the gas is pumped out through a purge line 7.

Similarly, a purging route for Ba line starts from another $N_2$ gas conduit (CA) in which a chemical (BC) carrying amine group is bubbled. This purging gas flows into a precursor container (BD) for Ba source, then into the manifold 2 and finally, is drained out through the purge line 7 by a pump.

For a purging route for Ti line, an $N_2$ gas conduit (CA), precursor container (BE) for Ti source the manifold 2 and the purge line 7 are selected.

During the overall depositing processes, a thin layer may be formed on the inner surface of the reactor. For better reproductivity of thin layer deposition, the undesirable thin layer should be removed by, for example, in-situ plasma etch of a cleaning conception.

In detail, the $CF_4$ or $C_2F_6$ gas contained in a cylinder (CB) or the $O_2$ gas contained in a cylinder (CE) is charged in the reactor. An RF power is applied to the plate for RF electrode, to excite plasma which, then, serves to etch the thin layer which may be deposited on the heater 6 and the plate 5 for RF electrode.

At this time, together with the plasma excitation at high temperature under low pressure, use of the precursors for Ba, Sr sources, in-situ synthesized with amine ligand, as reactant materials, contributes greatly to quality ferroelectric BST thin layer.

Independent of the reactor, the reproductivity can be enhanced by purging the reactant materials remaining in the gas lines.

It is found that the baffle guide and the plate for RF electrode is greatly helpful in increasing the yield of the deposition.

Figure 2:
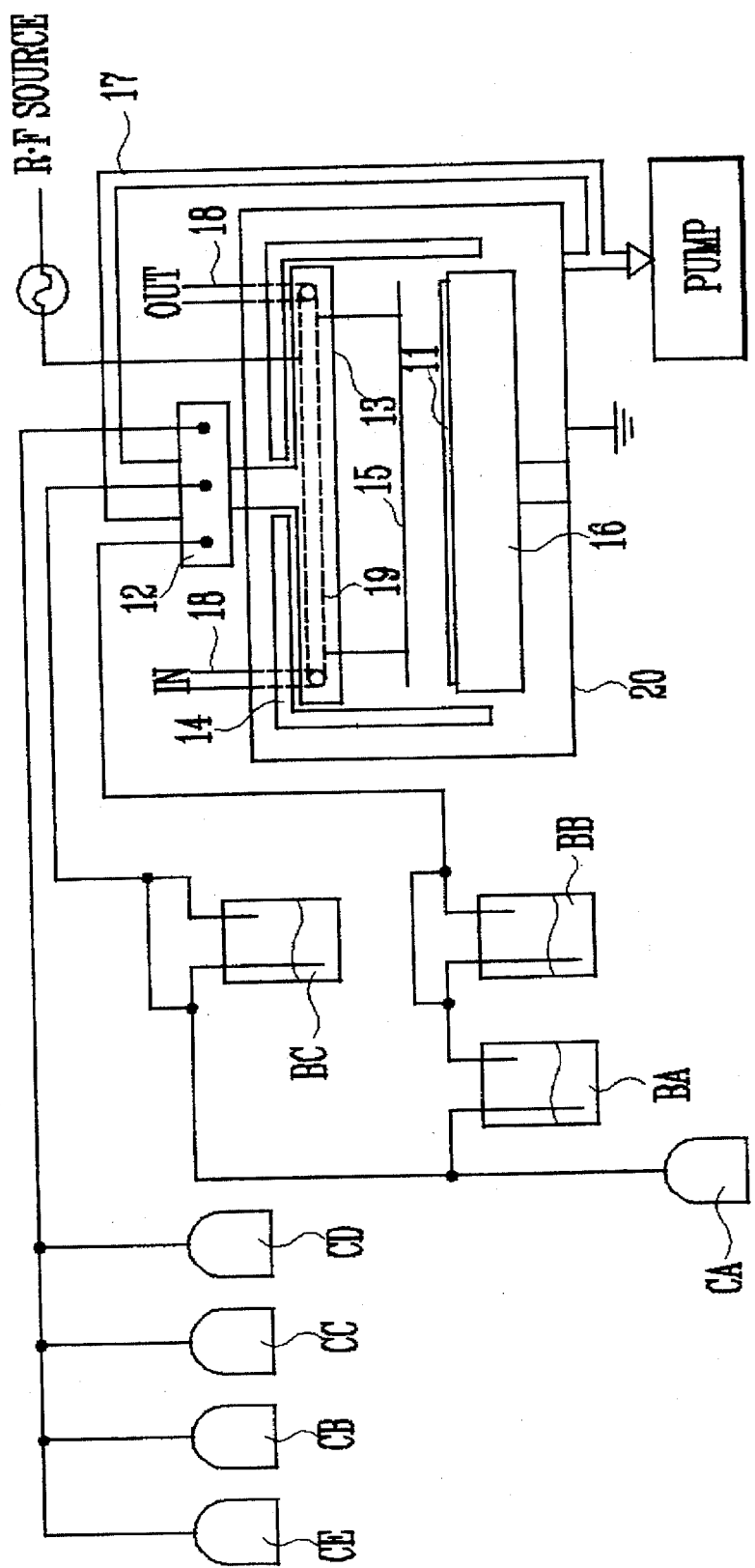
FIG. 2 is a schematic diagram showing an apparatus for forming an SAO or BTO ferroelectric thin film, according to a second embodiment of the present invention.

With reference to FIG. 2, an apparatus of depositing a BST or SAO thin layer is shown, according to a first embodiment of the present invention.

As seen in FIG. 2, the apparatus for depositing a BTO or SAO thin layer, according to the present invention, comprises a chamber body 20 of a circular or other form. The chamber 20 houses a wafer 1 and defines an inner space for depositing the wafer 11. Over the chamber body 20, a manifold 12 through which reactant materials are charged into the inner space of the chamber 20 is provided. Being connected with the manifold 12, a gas shower head 13 is set within the chamber body 20, in order to spray gaseous reactant materials. Indeed, the gas shower head 13 converts the reaction materials for thin layer coming out of the manifold 12 into a gaseous one and sprays it on the wafer 11. Also, a cylindrical baffle guide 14 is provided within the chamber body 20, surrounding the wafer 11 and the shower head 13. This baffle guide 14 functions to prevent the gas sprayed from the shower head 13 from being diffused too widely or from leaking into a vacuum port too fast. A plate 15 for RF electrode is provided over the wafer 11, in order to form plasma.

In the apparatus of depositing thin layers, the wafer 11 is heated to 500°–600° C. through a heater 16, to evaporate organic materials and moisture and to give a stable SAO thin film.

Under a vacuum condition of about 1 Torr or lower, the baffle guide 14 exhibits multi-purpose functions of controlling the flow of gas, increasing the fraction of the gas participating in the deposition, and preventing plasma from wide expansion.

The plate 15 for RF electrode is of a mesh type in which wires with a diameter of 1 mm are arranged at an interval of 2–3 mm and functions to excite plasma irrespective of the flow of the gaseous reactant materials sprayed from the shower head 13. By using the plate 15, the dissociation reaction of plural reactant materials can be promoted at a low RF power of 0.5–1 W/cm$^2$.

The gap between the shower head 13 and the plate 15 for RF electrode is an important factor in improving the uniformity of the thin layer deposited on the wafer 11. It is preferable to maintain the gap at about 10–50 mm. The plate 15 for RF electrode is also set apart at a distance of 3–10 mm from the wafer 11.

Using the apparatus according to the second embodiment of the present invention, a reliable ferroelectric SAO or BTO thin layer can be deposited. Conveniently, this deposition will be described largely in three stages: reactant materials and their supply; thin layer deposition; and reproductivity in thin layer deposition.

Initially, a description of the reactant materials and their supply will be given.

Sr(thd)$_2$ or Sr(i—O—Pr)$_2$ is typically employed as a Sr source, Ba(thd)$_3$ or Sr(i—O—Pr)$_3$ as a Ba source. Ti(i—O—Pr)$_4$ is representative of Ti source. Since most of Ba and Sr sources maintain themselves in solid states and Ti source is in liquid state at ordinary temperatures, the former should be changed into a fluid form in order to be supplied to an reactor. This can be achieved by heating to 150°–200° C. in an isothermal cabinet. As a result, the Sr source or the Ba source is sublimated. Then, a measure is devised to stabilize the sources thermally and chemically. For this, the chemicals (BA, BC) carrying amine group, e.g. NET$_3$, NH$_3$R or NH$_2$R wherein R is an alkyl, are heated at a certain temperature, for example, 50°–100° C. At this moment, the chemicals are allowed to be in contact with the Ba or Sr source and to react as a ligand with it by bubbling with N$_2$ gas (CA). The sublimated Ba or Sr source thus carrying amine groups is stable thermally and chemically even at high temperature, exerting high pressure.

The deposition rate of SAO or BTO thin layer can be controlled with the quantity of the Sr or Ba source, the flow rate of N$_2$ gas (CA), and the heating temperatures of the chemicals (BA, BC) carrying amine group and the Ba or Sr source.

Ti(i—O—Pr)$_4$ is employed to provide Ti and its flowing into the reactor can be controlled by heating temperature and the flow rate of the N$_2$ gas (CA).

Besides, the reactor is supplied with an oxidizing agent (CD) selected from N$_2$O and O$_2$ gas.

Then, to transfer the sublimated Ba or Sr source and the sublimated Ti source stably into the reactor, their respective gas conduits are used which are heated at 150°–200° C. for Ba or Sr source and at 50°–100° C. for Ti source.

When the sublimated Ba, Sr and Ti sources reach the reactor, they are heated at about 200° to 250° C. in order for them not to recondense. Ba, Sr, Ti and N$_2$O (or O$_2$) coming out of respective conduits are mixed together in the manifold 12 and then, led to the shower head 13. There is a fear that, within the shower head 13 by which the sublimated reactant materials are uniformly sprayed, gas phase reaction might occur by the thermal energy which is transferred from a heater 16 to heat the wafer 11, so the shower head 13 must be maintained at about 200° to 250°C. At this time, a coolant, such as, for example, water, oil, air and N$_2$ gas, is allowed to flow along the outermost route of the plate (18→19→18).

As to thin layer deposition, the sublimated plural reactant materials are kept in high temperature by plasma excitation at low pressure, thereby giving a ferroelectric BST thin layer with a good coatability, fine structure and uniform composition.

As the organic materials consisting of C, O and H element are used, there is a large difference in the activation energy of deposition among them. In addition, if pure thermal energy is applied to induce the deposition reaction, small quantities of some elements are deposited.

The difference among the reaction materials can be reduced by a plasma excitation technique in which RF power is applied for plasma excitation. For example, if an RF power with a low density of 0.5–1 Watt/cm$^2$ and a frequency of 13.56 MHz is applied to the shower head 13, the potential of a plate rod (2-R) for RF electrode is the same with that of the plate 15 for RF electrode because they are connected with the shower head 13. In such a state, grounding the heater 16 forms plasma between the plate 15 for RF electrode (including the wafer) and the heater 16, irrespective of the shower head 13.

In order to obtain a quality BST thin layer, process variables can be changed, including, for instance, the gap between the shower head 13 and the wafer 11.

In addition, the plate 15 for RF electrode may be set apart a certain distance from the wafer 11 to make plasma easily even at low RF power, irrespective of its gap from the shower head 13.

It is necessary at a low pressure of about 1 Torr or less, to provide the thin layer with good coatability and fine structure free of organic materials and moisture. Under such low pressure, the gas may flow nonuniformly between the shower head 13 and the wafer 11, the effective gas fraction to participate in the deposition is lowered and the plasma expands to deposit SAO or BTO thin layer on undesirable sites. For the prevention of these side effects, the baffle guide 14 is made of an electrical insulating material, for instance, ceramic or quartz and is set apart 3–5 mm from the heat 16.

Since most of the Ba, Sr, Ti sources contain a large quantity of carbon, oxygen, hydrogen and moisture, they must be removed produce a quality thin layer. This can be accomplished simply by adding an oxidizing agent, such as O$_2$ or N$_2$O at about 500° C. or higher. At this time, the heater 16 in the direct contact with the wafer 11 is used to heat the wafer 1 at about 500° C. or higher.

Finally, there will be described below that the SAO or BTO thin layer is reproduced in wafer to wafer manner or run to run manner.

It is necessary to remove the residual gas adhering to the gas conduits and the SAO or BTO thin layer deposited on the plate 15 for RF electrode. First, to purge the residual gas, the sublimated chemical carrying amine group is blown in the lines for Ba or Sr and for Ti by using N$_2$ gas (CA) or N$_2$ carrier gas. The purging gas is collected in the manifold 12 and then, exhausted for a predetermined time, for example, ten seconds or a few minutes, through a purging line 17 by a pump, irrespective of the reactor. The flow of the purging gas traces the routes as follows.

A purging route for Sr or Ba line starts from an $N_2$ gas conduit (CA) in which a chemical (BA) carrying amine group is bubbled and extends through a precursor container (BB) of Sr or Ba source into the manifold 12 from which the gas is pumped out through a purging line 17.

Similarly, a purging route for Ti line starts from another $N_2$ gas conduit (CA) in which a chemical (BC) carrying amine group is bubbled. This purging gas flows into a precursor container (BC) for Ti source, then into the manifold 12 and finally, is drained out through the purge line 17 by the pump.

During the overall depositing processes, an SAO or BTO thin layer may be formed on the plate 15 for RF electrode. For better reproductivity of thin layer deposition, the undesirable thin layer can be removed by, for example, blowing $CF_4$ or $C_2F_6$, $NF_3$, $SF_4$, $CCl_4$ and $O_2$ between the plate 15 for RF electrode and the heater 16 while exciting plasma, without loading wafer 11.

By the above-mentioned method, the potential of the plasmas formed over the wafer 11 during the deposition can be constantly maintained and good reproductivity can be secured.

As described hereinbefore, the method for forming a ferroelectric thin layer and the apparatus therefor are characteristic in that, together with the plasma excitation at high temperature under low pressure, use of the precursors for Ba, Sr sources, in-situ synthesized with amine ligand, as reactant materials, gives a great contribution to a quality ferroelectric BST, SAO or BTO thin layer which is superior in fineness in structure, coatability and uniformity in composition and free of impurities.

Independent of the reactor, the reproductivity can be enhanced by purging the reactant materials remaining in the gas lines, in accordance with the present invention.

The method and the apparatus in accordance with the present invention is advantageous in that the baffle guide and the plate for RF electrode is very helpful in increasing the yield of the deposition.

In addition, the present invention shows another advantage in preventing the by-products attributed to incomplete reaction from adhering to a wafer.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for forming a ferroelectric thin film on a wafer, comprising the steps of:
   inducing ferroelectric reactant materials consisting of plural elements into dissociation by exciting plasma with RF power;
   setting an optimal process condition in which the ions dissociated from said reactant materials by the excited plasma are subjected to deposition at high temperatures under low pressures;
   supplying said reactant materials through conduits, a manifold and a shower head to a reactor without deterioration, said manifold collecting said reactant materials, said shower head serving to spray the mixed reactant materials; and
   depositing a ferroelectric thin film, on the wafer in said reactor while purging residual gas from the conduits.

2. A method in accordance with claim 1, wherein said purging is carried out by use of sublimated chemicals carrying amine group or $N_2$ gas and said residual gas is exhausted through said manifold by a pump.

3. A method in accordance with claim 1, wherein said conduits are heated at 200° to 300° C. whereby recondensing of the dissociated reactant materials is prevented.

4. A method in accordance with claim 1, wherein said shower head is maintained at 200° to 250° C. whereby said reactant materials are prevented from experiencing a gas phase reaction to form particles.

5. A method in accordance with claim 1, further comprising the step of: etching undesirable by-products deposited within said reactor with $CF_4$ or $C_2F_6$, $NF_3$, $SF_4$ and $O_2$ purified by plasma.

6. A method in accordance with claim 1, wherein said reactant materials are those in which an amine group can be in-situ synthesized as a ligand.

7. A method in accordance with claim 6, wherein said amine group is in-situ synthesized by using $NET_3$ or $NH_2R$ as a carrier gas.

8. A method in accordance with claim 1, wherein said ferroelectric thin film is a BST thin film.

9. A method for forming a ferroelectric thin film on a wafer, comprising the steps of:
   inducing ferroelectric reactant materials consisting of plural elements into dissociation by exciting plasma with RF power;
   setting an optimal process condition in which the ions dissociated from said reactant materials by the excited plasma are subjected to deposition at high temperatures under low pressures;
   combining an amine ligand with said reactant materials and supplying the combined reactant materials through conduits, a manifold and a shower head to a reactor at a high temperature under a low vapor pressure without deterioration, said manifold collecting said reactant materials, said shower head serving to spray the mixed reactant materials;
   controlling the temperatures of said conduits, said manifold and said shower head; and
   depositing a ferroelectric thin film on the wafer in said reactor while purging residual gas from the conduits.

10. A method in accordance with claim 9, wherein said ferroelectric thin film is an SAO thin film.

11. A method in accordance with claim 9, wherein said ferroelectric thin film is a BTO thin film.

12. A method in accordance with claim 9, wherein said purging is carried out by use of sublimated chemicals carrying amine group or $N_2$ gas and said residual gas is exhausted through said manifold by a pump.

13. A method in accordance with claim 12, wherein said conduits are heated at 200° to 300° C. to prevent recondensing of the dissociated reactant materials and gas for purging.

14. A method in accordance with claim 9, wherein said shower head is maintained at 200° to 250° C. to prevent said reactant materials from experiencing a gas phase reaction to form particles and said RF power is an alternative type.

15. A method in accordance with claim 9, further comprising the step of: etching undesirable by-products deposited within said reactor with $CF_4$ or $C_2F_6$, $NF_3$, $SF_4$ and $O_2$ purified by plasma.

16. An apparatus for forming a ferroelectric thin film, comprising:

a chamber body defining a depositing space;

a manifold provided over the chamber body for collecting reactant materials;

a shower head means for converting the reactant materials of the manifold into a gaseous state and for spraying the reactant materials in the gaseous state on a wafer;

a baffle guide means surrounding the shower head, the wafer and a heating block, for preventing the gas sprayed from the shower head from expanding widely and from leaking directly into a vacuum port; and a plate for RF electrode provided over the wafer and for forming plasma.

17. An apparatus in accordance with claim 16, further comprising a means for maintaining or controlling the manifold at a predetermined temperature in order not to re-condense reactant materials into their liquid or solid phase at ordinary temperature in the manifold.

18. An apparatus in accordance with claim 16, wherein said plate for RF electrode is a mesh type in which wires with a diameter of 0.5 to 1.5 mm are arranged at an interval of 2 to 3 mm.

19. An apparatus in accordance with claim 16, wherein said baffle guide is made of an electrically insulating material and is 3–5 mm apart from a plate on which said wafer is placed.

* * * * *